United States Patent [19]
Le et al.

[11] Patent Number: 5,852,576
[45] Date of Patent: Dec. 22, 1998

[54] HIGH VOLTAGE NMOS PASS GATE FOR INTEGRATED CIRCUIT WITH HIGH VOLTAGE GENERATOR AND FLASH NON-VOLATILE MEMORY DEVICE HAVING THE PASS GATE

[75] Inventors: Binh Quang Le, Mountain View; Pau-Ling Chen, Saratoga; Shane Charles Hollmer, San Jose; Shoichi Kawamura, Sunnyvale; Michael Shingche Chung, San Jose; Vincent C. Leung, Mountain View; Masaru Yano, Sunnyvale, all of Calif.

[73] Assignees: Advanced Micro Devices, Inc., Sunnyvale, Calif.; Fujitsu Limited, Kanagawa-ken, Japan

[21] Appl. No.: 944,904

[22] Filed: Oct. 6, 1997

Related U.S. Application Data

[63] Continuation-in-part of Ser. No. 808,237, Feb. 28, 1997.
[51] Int. Cl.[6] ........................... G11C 13/00
[52] U.S. Cl. ..................... 365/185.33; 365/218
[58] Field of Search .................. 365/185.33, 218

[56] References Cited

U.S. PATENT DOCUMENTS

| | | | |
|---|---|---|---|
| 5,039,882 | 8/1991 | Arawaka | 307/296.2 |
| 5,315,188 | 5/1994 | Lee | 307/574 |
| 5,333,122 | 7/1994 | Ninomiya | 365/189.11 |

FOREIGN PATENT DOCUMENTS 0 576 008 A2  12/1993  European Pat. Off. .

*Primary Examiner*—Terrell W. Fears
*Attorney, Agent, or Firm*—Fliesler, Dubb, Meyer & Lovejoy

[57] ABSTRACT

Two NMOS boost transistors have their sources connected to the high voltage input while their drains and gates are cross-connected. Two coupling capacitors connect two alternate phase clocks to the gates of the two cross-connected boost transistors. An NMOS pass transistor has its gate connected to the drain of one of the NMOS boost transistors, its source connected to the high voltage input, and its drain connected to the output. In an embodiment, two diode-connected regulation transistors connect the gates of the boost transistors to the high voltage input. These connections insure that the gates of the boost transistors and the gate of the pass transistor never reach voltages higher than one threshold voltage above the high voltage input. In another embodiment, two discharge transistors have their drains connected to a decode input, their sources connected to the gates of the boost transistors, and their gates connected to the positive power supply. By setting the decode input at zero volts, the voltages at the gates of the boost transistors and of the pass transistor are held at zero volts, thus disabling them. In the preferred embodiment, both the regulation transistors and the discharge transistors are included in the high voltage pass gate.

25 Claims, 8 Drawing Sheets

5,852,576

HIGH VOLTAGE NMOS PASS GATE FOR INTEGRATED CIRCUIT WITH HIGH VOLTAGE GENERATOR AND FLASH NON-VOLATILE MEMORY DEVICE HAVING THE PASS GATE

RELATED U.S. APPLICATION DATA

This application is a Continuation-In-Part of application Ser. No. 08/808,237, filed Feb. 28, 1997.

BACKGROUND OF THE INVENTION

1. Field of the Invention

The present invention relates to the field of high voltage pass gates in integrated circuits which generate the high voltage internally from a lower positive supply voltage and also to flash memory having the high voltage pass gates. Specifically, the present invention relates to NMOS implementations of high voltage pass gates and also the programming and erasing of flash non-volatile memory devices using the NMOS high voltage pass gates.

2. Discussion of the Related Art

In flash memory integrated circuits, high voltages are generated on the chip for programming purposes. These high voltages (around 20 V) are much higher than the highest supply voltage (around 3 V), and are typically produced by large charge pumps. Because these charge pumps consume power and circuit area, it is desirable to minimize the total capacitance that these high voltage generators drive.

In most CMOS integrated circuits, PMOS transistors are used to pass the higher supply voltages, while NMOS transistors are used to pass the lower supply voltages. For example, PMOS transistors are used to implement pull up circuits, while NMOS transistors are used to implement pull down circuits. However, PMOS transistor subcircuits in a CMOS integrated circuit must be electrically isolated in an N-type well which must be biased at or above the same high voltage to guarantee that the P/N junction formed by the P-type drain/source regions of the PMOS transistors and the N-type well are not forward biased. If PMOS transistors are used in the high-voltage subcircuits, these N-type isolation wells constitute a prohibitively large capacitance for the on-chip high voltage generator to drive. Therefore, in high-voltage subcircuits supplied by on-chip high-voltage generators, the use of NMOS transistors is typically preferable to the use of PMOS transistors.

However, the voltage which can be passed by an NMOS transistor is limited by the transistor's threshold voltage Vt. If a gate voltage Vg is applied to an NMOS transistor's gate, then the maximum voltage which can be passed from source to drain is Vg-Vt. If the voltage generator produces a maximum voltage Vpp (about 20 V), it is desirable for transistors passing or switching that high voltage to pass Vpp without incurring the threshold voltage drop. In other words, the pass transistors should pass Vpp rather than Vpp-Vt. Therefore, in order to pass a high voltage Vpp through an NMOS device, its gate must be boosted to a voltage higher than the high voltage by at least one threshold voltage Vt, so that Vpp+Vt must be applied to the gate of the NMOS pass transistor.

A conventional circuit which is used to pass a high voltage Vpp is illustrated in FIG. 1. The circuits of the kind illustrated in FIG. 1 are very important in NAND flash memory applications, especially for decoding circuits such as row decodes and high-voltage multiplexors. Unfortunately, the circuit in FIG. 1 has several major drawbacks.

The first drawback is that the circuit performance is degraded as the supply voltage Vcc decreases. Moreover, the circuit is inoperative when the supply voltage Vcc is less than the sum of the threshold voltages VtM2 and VtM3 of transistors M2 and M3, respectively. In order to pass Vpp to the output OUT, node B (attached to the gate of M3) must be boosted to Vpp+VtM3. In order for node B to be boosted to Vpp+VtM3, node A must be boosted to Vpp+VtM3+VtM2. With supply voltages Vcc around 3 V, and threshold voltages above 1.5 V due to the body effect, the circuit in FIG. 1 does not function properly.

In order to boost node A to Vpp+VtM3+VtM2, the following inequality must hold.

$$Vcc \geq VtM2 + VtM3$$

To illustrate this fact, consider the following example. If node A is boosted to Vpp when the oscillator input is at 0 V, when the oscillator goes high to Vcc, the voltage at node A is coupled up to Vpp+Vcc because the voltage across capacitor C cannot change instantaneously. For now, we will ignore the parasitic capacitances on nodes A and B, but we will consider them with respect to the present invention. Transistor M2 charges node B to Vpp+Vcc−VtM2. The output OUT passed by transistor M3 is then the lower of Vpp and Vpp+Vcc−VtM2−VtM3. If the voltage at node B is higher than Vpp by VtM3, then the voltage at the output Vout will be pulled up to Vpp. Unless Vcc≧VtM2+VtM3, transistor M3 will be saturated, and the output OUT will be less than Vpp.

Transistor M1 provides the charge which is pumped onto node B and also regulates the voltage at node A. When the DECODE input is Vcc, transistor M4 is in cut off and the boost circuit is enabled so that the output OUT is driven to Vpp. However, when the DECODE input is grounded, the transistor M4 holds node B at ground thus keeping transistor M3 in cutoff so that the output OUT is not driven.

In order for the circuit in FIG. 1 to function with low supply voltages Vcc less than or equal to 3 V, transistors M2 and M3 must have very low threshold voltages VtM2 and VtM3. However, the various manners of lowering the threshold voltage of a transistor all result in larger leakage currents from source to drain when the transistor is off.

Typically, the high voltage pass gate of FIG. 1 is used to drive word lines of a memory array during a programming operation. The memory array may have many thousands of word lines. Often only one word is programmed while all the other words are not programmed. In this case, only one of the word lines is raised to Vpp while all other word lines are not raised to Vpp. If transistor M3 is made to be a low threshold device and is replicated once for each word line, the sum of the leakage currents in all of the program inhibited words will be very high, thus placing high current demands on the high voltage charge pump and wasting a large amount of power.

Furthermore, to discharge node B from a high voltage, transistor M4 must be turned on when its drain to source voltage is around 20 V. For some technologies, "hot switching" will occur when M4 is turned on when its drain voltage is too high. When more than about seven volts exists at the drain, a very high field exists across the device. When the device starts to turn on, it turns on very hard. Because a very large field exists in the depletion region of the drain to substrate junction, a snap back effect occurs when the device turns on. The snap back effect is a consequence of the fact that the NMOS structure begins to operate like an NPN bipolar transistor rather than an NMOS transistor. In an NMOS transistor, the drain to source current is limited to the channel at the surface of the substrate. However, when the drain to substrate junction breaks down, the local substrate is charged enough to cause the substrate to source junction to become forward biased. At this point, the transistor begins to behave like an NPN bipolar transistor, with a current flowing beneath the surface of the substrate underneath the channel. After snap back has occurred, a current is available from source to drain. This snap back current will cause the device to wear out very quickly.

Another disadvantage of the conventional circuit of FIG. 1 is that at node A, the n+ drain regions of transistors M1 and M2 are boosted very high to Vpp+VtM1+VtM2. Because the p-type substrate is typically grounded, the reversed biased n+/p− diode junctions at the drains of transistors M1 and M2 must carry this very high reverse biased voltage. The high voltage at node A places a burden on the technology to support a transistor with very high junction breakdown voltage.

As is apparent from the foregoing discussion, a need exists for a high voltage pass gate that works well under low supply voltage conditions but which does not require unusually low threshold transistors. Similarly, a need exists for high voltage pass gate which do not run unnecessary risks of hot switching from occurring in their discharge transistors.

SUMMARY OF THE INVENTION

Conventional high voltage NMOS pass gates require internal nodes to be boosted two transistor threshold voltages above the high voltage to be passed. This places a constraint upon the minimum supply voltage and upon the maximum threshold voltage of the transistors; furthermore, boosting internal nodes two transistor thresholds above the high voltage increases the risk of the occurrence of junction breakdown in all transistors that connect to these nodes. Therefore, an object of the present invention is to create a high voltage NMOS pass gate which requires only minimal boosting of internal nodes to pass full high voltage to the outputs.

According to the present invention, two NMOS boost transistors have their sources connected to the high voltage input while their drains and gates are cross-connected. Two coupling capacitors connect two inverse phase clocks to the gates of the two cross-connected boost transistors. An NMOS pass transistor has its gate connected to the source of one of the NMOS boost transistors, its drain connected to the high voltage input, and its source connected to the output. The inverse phase clocks couple the gates of their corresponding boost transistors above their threshold voltages, thus charging the capacitors and increasing the voltages at the sources of the boost transistors. Eventually, the gate of the NMOS pass transistor is elevated to one threshold voltage above the high voltage input, causing the pass transistor drives the high-voltage onto the output.

In an embodiment of the present invention, two diode-connected regulation transistors connect the gates of the boost transistors to the high voltage input. These connections insure that the gates of the boost transistors and the gate of the pass transistor never reach voltages higher than one threshold voltage above the high voltage input. In this embodiment, when the high voltage input is lowered, the regulation transistors also lower the voltages at the gates of the boost transistors.

In another embodiment, two discharge transistors have their sources connected to a decode input, their drains connected to the gates of the boost transistors, and their gates connected to the positive power supply. By setting the decode input at zero volts, the voltages at the gates of the boost transistors and of the pass transistor are held at zero volts, thus disabling them.

In the preferred embodiment, both the regulation transistors and the discharge transistors are included in the high voltage pass gate. The clocks are generated by a two-input NAND gate having the decode input and an oscillating signal as inputs and producing the inverted clock as output. An inverter takes the inverted clock as input and produces the non-inverted clock as output.

The coupling capacitors are sized so to insure that the increase in voltage at the gates of the boost transistors caused by the rising edges of the inverse phase clocks is greater than the threshold voltage. This insures that low supply voltage and high threshold voltage operation are achieved.

According to another aspect of the present invention, the high voltage pass gate is connected to the word line of an array of flash memory cells.

These and other features and advantages of the present invention will be apparent from the Detailed Description of the Invention in conjunction with the Figures.

The Figures are more thoroughly explained in the Detailed Description of the Invention.

DETAILED DESCRIPTION OF THE INVENTION

Figure 1:
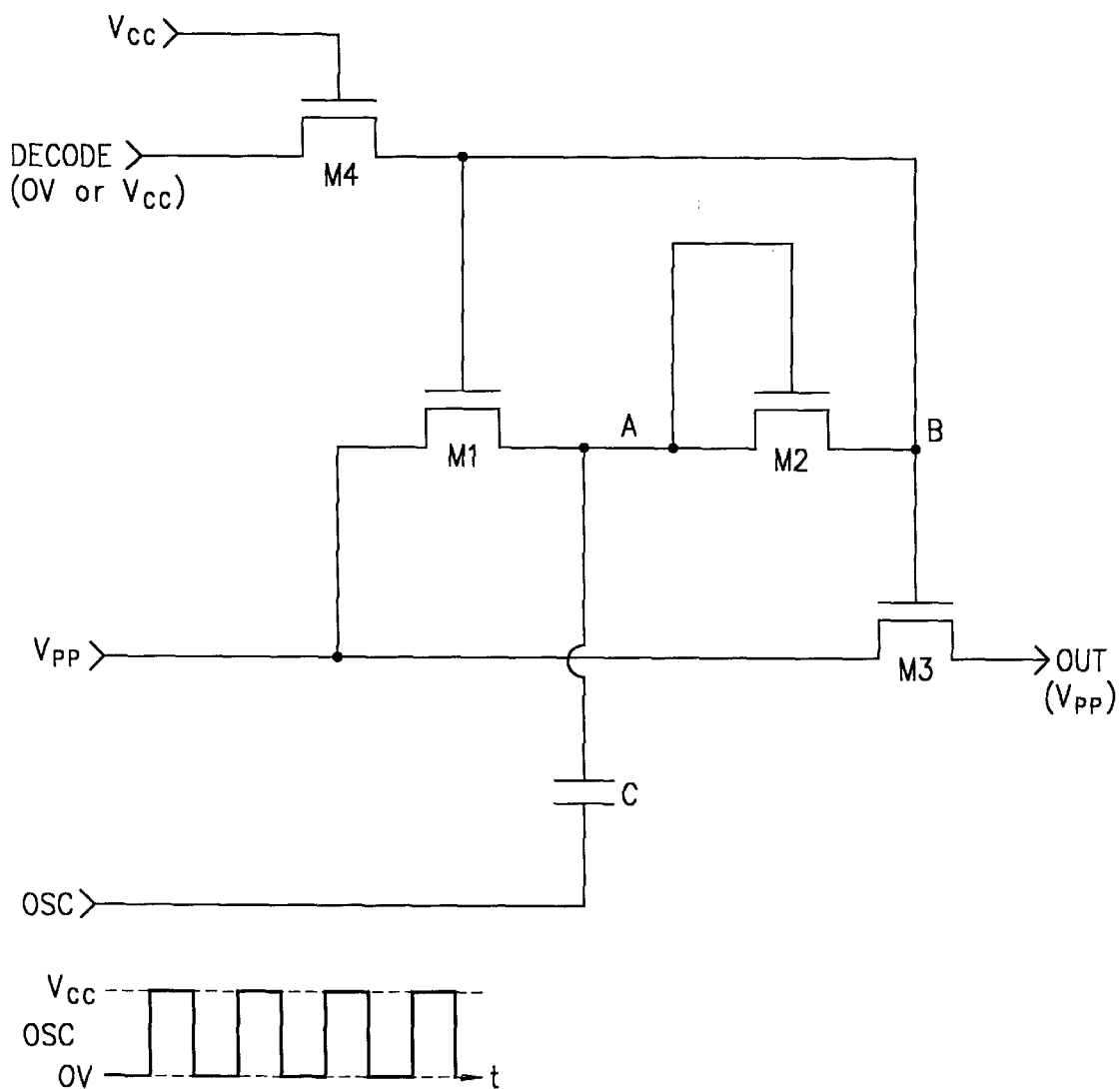
FIG. 1 illustrates a conventional circuit for passing a high voltage using NMOS transistors only.
Figure 2:
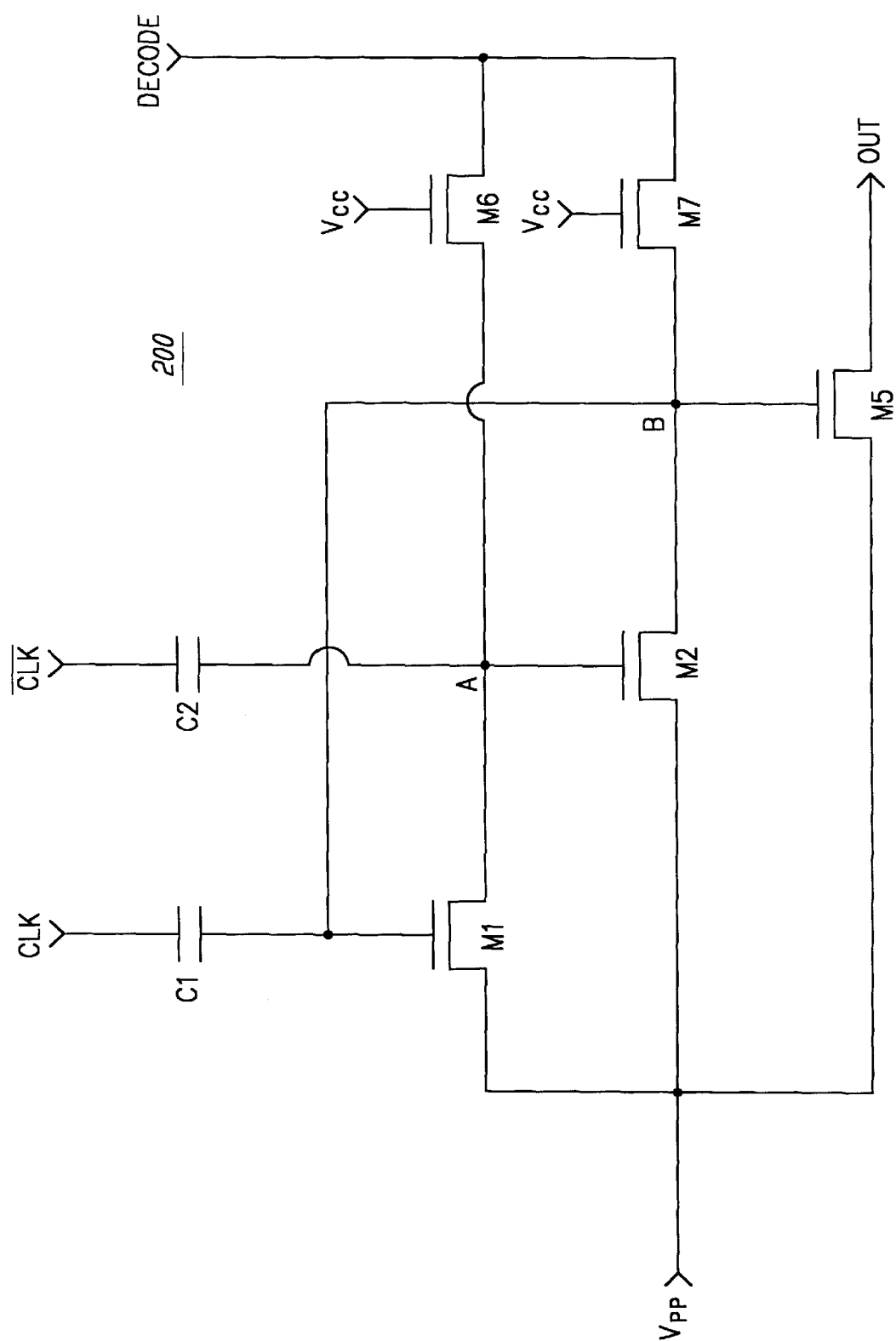
FIG. 2 illustrates a circuit for passing a high voltage using NMOS transistors only according to an embodiment of the present invention.

FIG. 2 illustrates an embodiment 200 of the present invention. Assume for the moment that nodes A and B are charged to ground. The DECODE signal will go from zero to Vcc, and nodes A and B will be charged to Vcc-Vt. The clock CLK oscillates from zero to Vcc; the inverted clock /CLK is the opposite phase of the clock CLK. When the clock CLK goes from zero to Vcc, the voltage at node B quickly increases by Vcc*C1/(C1+CB) because capacitances C1 and CB are in series with intermediate node B. CB represents the total capacitance to ground at node B. This capacitance CB is the sum of the drain capacitances of transistors M2 and M7, the gates capacitance of transistors M1 and M5. While CLK is at Vcc, transistor M1 charges node A to Vpp. When CLK falls to zero and /CLK rises to Vcc, transistor M1 cuts off, and capacitor C2 increases the voltage at node A by Vcc*C1/(C1+CB). CA represents the total capacitance to ground at node A. This capacitance CA is the sum of the drain capacitances of transistors M1 and M6 and the gate capacitance of transistor M2. While CLK is at Vcc, transistor M2 charges node B to Vpp.

Typically, Vpp is produced by a charge pump with limited capacity. When a programming operation is performed, Vpp is typically linearly increased from zero to a high voltage, as illustrated by the trace 602 in FIG. 6. The slope of the increase in Vpp is determined by the capacity of the charge pump. It is desirable for nodes A and B and the output OUT to track Vpp as closely as possible in a selected pass gate. In order for the rising of CLK and /CLK to switch transistors M1 and M2 on from cut off, the following inequalities must hold.

Vcc*C1/(C1+CB)>VtM1  (Inequality 1)

Vcc*C2/(C2+CA)>VtM2  (Inequality 2)

The threshold voltages of transistors M1 and M2 are typically equal (VtM1=VtM2). Node B has an additional circuit element, the gate of pass transistor M5, attached to it; therefore, the first inequality is typically the more difficult to satisfy. The size of capacitance C1 can be increased to insure that this inequality is satisfied. Generally, after several clock cycles while transistors M1 and M2 switch off and on, the voltage at node B is equal to Vpp.

The boosting of nodes A and B is not altogether symmetric; however, because node B has the gate capacitance of M5 attached to it while node A has no analogous gate capacitance associated with it. The total load capacitance CB to ground at node B is influenced by the all of the circuit elements connected to node B. Specifically, the gate capacitance of transistor M5, the drain capacitance of transistor M2, the gate capacitance of transistor M1, and, in the preferred embodiment, the drain and gate capacitance of transistor M4. When an increase in voltage of Vcc occurs at the clock input CLK the voltage at node B increases by Vcc * C1 / (C1+CB). In order to enable the turning on of transistors M1 and M2, this increase in voltage at node B must be greater than the threshold voltage of transistor M1. Thus, Vcc * C1/(C1+CB)>VtM1. Unless this inequality holds, capacitor C1 is unable to couple the gate of transistor M1 high enough to turn it on. Capacitor C1 is therefore sized to be large if CB is large.

If the clocks CLK and /CLK continue to run after Vpp has reached its highest final value, capacitive coupling through transistors C1 and C2 will further boost nodes A and B during alternate phases of the clock CLK.

In the embodiment 200 illustrated in FIG. 2, the voltage at node A voltage will oscillate between Vpp to Vpp+Vcc*C2/(C2+CA) in synchronism with /CLK while the voltage at node B will oscillate between Vpp and Vpp+Vcc*C1/(C1+CB) in synchronism with CLK. In this embodiment, transistor M1 will remain in cut off after it has charged node A to Vpp during the high phase of CLK, and transistor M2 will remain in cut off after it has charged node B to Vpp during the high phase of /CLK. Because transistors M1 and M2 remain in cut off, neither transistor sources any current from Vpp.

The circuit 200 of FIG. 2 is very robust. It performs at a very low supply voltage Vcc and very high transistor threshold voltages Vt. The above discussion refers to the transistor threshold voltages VtM1 and VtM2 as potentially different voltages. However, because typically all of the transistors in the circuit according to the present invention are fabricated using the same doping levels and other fabrication parameters, in practice all transistors will normally have the same threshold voltage Vt.

Figure 3:
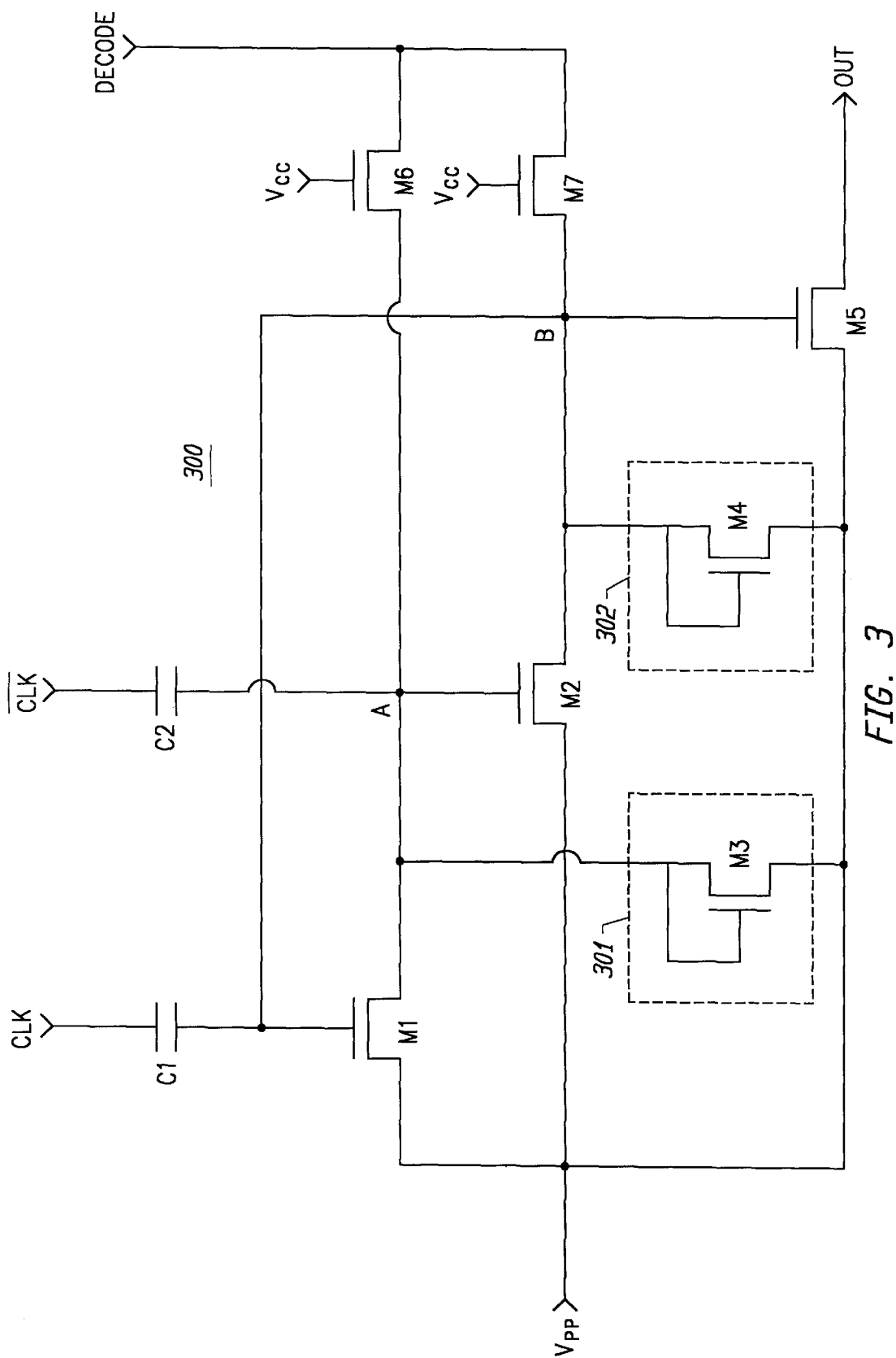
FIG. 3 illustrates a circuit for passing a high voltage using NMOS transistors only according to the preferred embodiment of the present invention.

FIG. 3 illustrates the preferred embodiment 300 of the present invention. The circuit 300 of FIG. 3 includes two regulation devices 301 and 302 attached to nodes A and B, respectively. The inclusion of regulation devices 301 and 302 helps to avoid the possibility of hot switching occurring in decode transistors M6 and M7. If the clocks are running when Vpp is discharged, transistors M3 and M4 are not necessary.

A typical application for the present invention is to drive the word lines in a flash memory array having a very large number of words. These high voltage pass circuits may exist on a per block basis; therefore, a large number of these circuits exist for a flash memory array. The programming of a word requires a high programming voltage Vpp which is typically around 20 V. Because the only supply voltages are Vcc (about 3 V) and ground (zero volts), this high programming voltage Vpp is generated by an on-chip high voltage charge pump. In some programming modes, only one word is written at a time. Therefore, it is desirable to enable one set of high voltage pass transistors driving the selected block while all other high voltage pass transistors are disabled from driving Vpp onto their word lines. In this event, a mechanism must exist for ensuring that nodes A and B are discharged down to zero volts for all unselected blocks.

To facilitate this behavior, the circuits according to the embodiments of present invention have decode transistors M6 and M7. The sources of decode transistors M6 and M7 are connected to nodes A and B, respectively, and the drains of transistors M6 and M7 are connected to a word decode signal DECODE. When the DECODE signal is asserted at Vcc, transistors M6 and M7 are in cut off, thus the nodes A and B are free to be boosted upward. When the DECODE signal is grounded, transistors M6 and M7 are turned on and hold nodes A and B at ground. Because nodes A and B are tied to ground, neither boost transistor M1 nor M2 is turned on. The pass transistor M5 is also turned off as it is gated by node B. Thus, there is no power dissipation sourced from the Vpp charge pump supply in the non-selected words.

More importantly, transistors M6 and M7 discharge nodes A and B from a voltage higher than Vpp when a previously selected word becomes unselected. In the preferred embodiment 300 shown in FIG. 3, transistors M3 and M4 are attached to nodes A and B with their drains connected to their gates so as to behave like diodes. These transistors regulate the voltages at nodes A and B, respectively, so that the maximum static voltage at node A is Vpp+VtM3 while the maximum static voltage at node B is Vpp+VtM4. The objective of the circuit is to pass the high voltage Vpp to the output OUT through transistor MS. Because node B controls the gate of transistor M5, it is necessary to charge node B to Vpp+VtM5. If transistors M4 and M5 are fabricated so as to have the same threshold voltage (VtM4=VtM5), then the inclusion of the diode-connected regulation transistor M4 guarantees that node B is statically maintained at a voltage no further than is necessary to accomplish the desired result of passing Vpp through to the output OUT.

In the embodiment 200 illustrated in FIG. 2 without diode-connected regulation transistors M3 and M4, node A is statically maintained at a voltage of Vpp+Vcc*C2/(C2+CA) during the high phase of CLK while node B is statically maintained at a voltage of Vpp+Vcc*C1/(C1+CB) during the high phase of /CLK. In the embodiment 300 illustrated in FIG. 3 with diode-connected transistors M3 and M4, although node A reaches a maximum voltage of Vpp+Vcc*C2/(C2+CA) at the rising edge of CLK, the regulation transistor M3 discharges node A to Vpp+VtM3 before the falling edge of CLK. Similarly, although at the rising edge of /CLK node B is boosted to Vpp+Vcc*C1/(C1+CB), the regulation transistor M4 discharges node B to Vpp+VtM4 before the falling edge of /CLK.

Moreover, if the charge pump (not shown) which generates Vpp is turned off and Vpp is discharged to some lower voltage (Vcc or ground), then the inclusion of transistors M3 and M4 in the circuit 300 according to preferred embodiment of the present invention allows for nodes A and B to be automatically discharged along with Vpp through transistors M3 and M4, which will track the discharge of Vpp one threshold voltage Vt above Vpp. Thus, the preferred embodiment 300 in FIG. 3 minimizes the possibility of hot switching occurring in the discharge transistors M6 and M7 because nodes A and B are regulated so that when Vpp decreases, the voltages at nodes A and B also decrease. When the decode signal is then lowered to ground, the voltages at nodes A and B are no longer near the 20V programming voltage.

Figure 4:
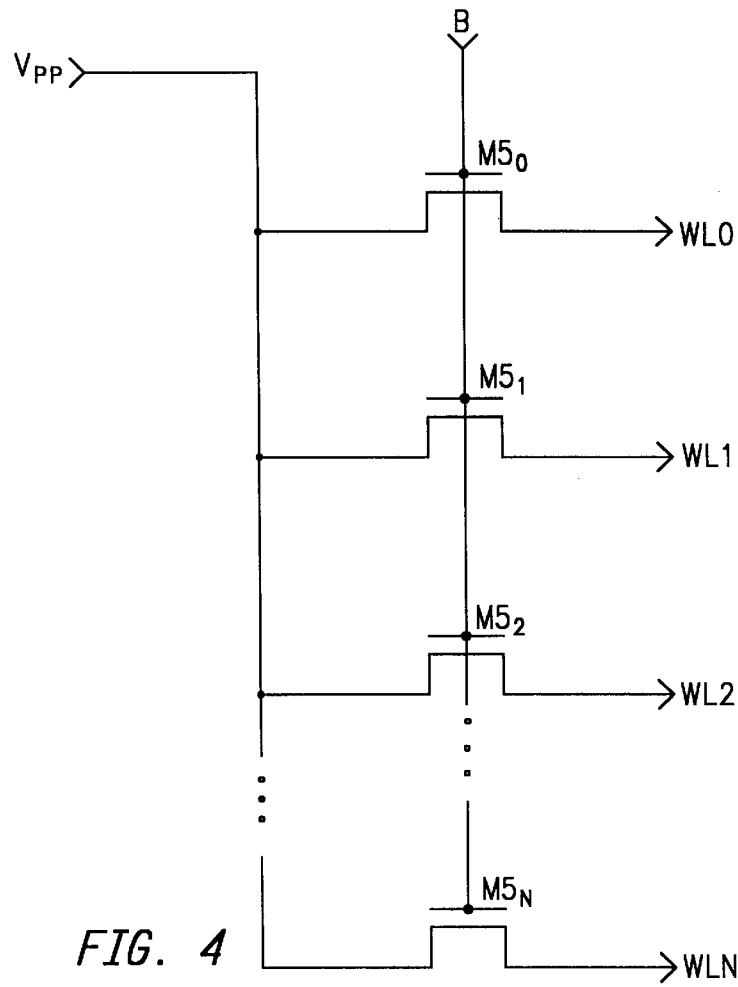
FIG. 4 illustrates another application of the present invention in which several parallel pass transistors are controlled by the same circuit so that a high voltage is passed to several outputs.

According to another aspect of the present invention, FIG. 4 illustrates that multiple parallel pass transistors M50–M5N drive multiple word lines wL0–wLN while being controlled by the same node B. There are several situations in which this configuration is desired. For example, the physical dimensions of the particular memory array may require that several word lines exist for each word. As another example, the high voltage switch may be used only in the programming of several words at the same time. As a further example, in a NAND flash memory array, all the pass transistors corresponding to a give NAND cell must be enabled whenever any one of the words in that cell are programmed. Depending upon the sizes of the multiple pass transistors M50–M5N shown in FIG. 4, the capacitance to ground CB at node B may be quite large, and the capacitors C1 must be sized large enough to insure that inequality (1) is satisfied.

Figure 5:
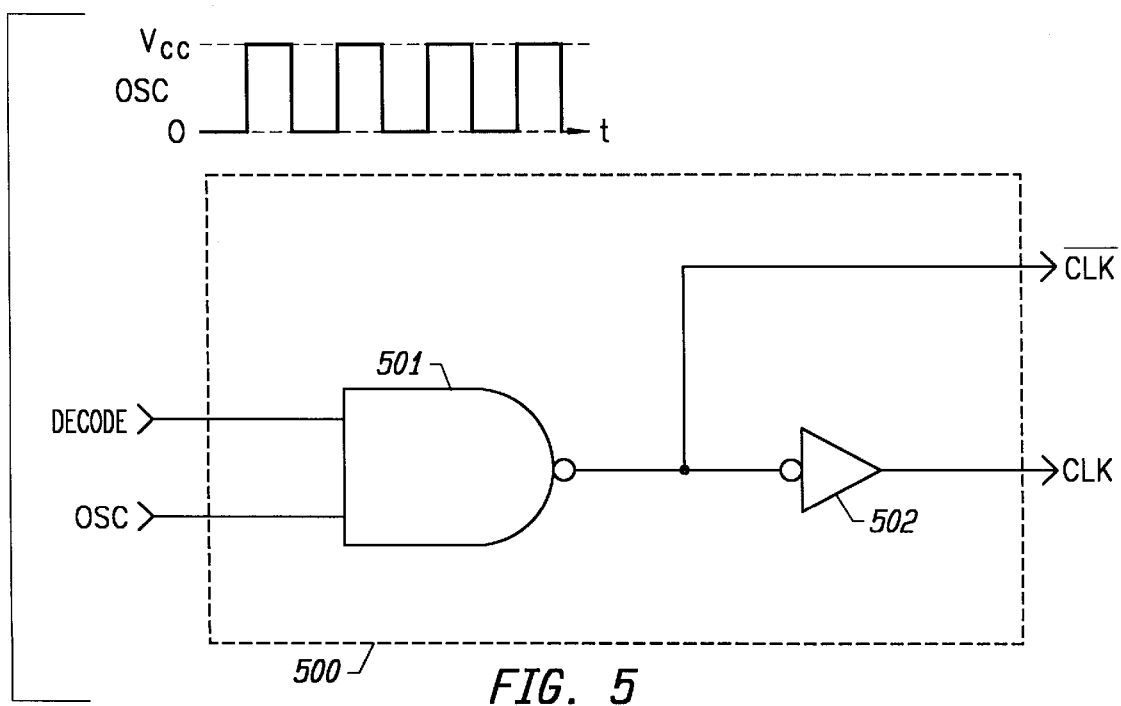
FIG. 5 illustrates the preferred embodiment of the clock generation according to the present invention in which the clocks are disabled when a word is non-selected.

According to another aspect of the present invention, FIG. 5 illustrates the preferred embodiment 500 of the clocking circuit 500 for use in conjunction with the high voltage switch circuits 200 and 300 illustrated in FIGS. 2 and 3. This clock buffer 500 exists on a per switch basis; therefore, for each high voltage switch circuit 200 or 300, a separate clock buffer 500 exists. A single phase oscillator signal OSC is generated either on-chip or input externally. A two-input NAND gate 501 takes the oscillator signal OSC and the decode signal DECODE as inputs and produces the inverted clock /CLK signal. An inverter 502 takes the inverted clock signal /CLK as input and produces the non-inverted clock signal CLK as output.

Whenever the DECODE signal is low for a given high voltage switch 200 or 300, the oscillation of the clocks CLK and /CLK is disabled such that CLK is statically maintained at ground while /CLK is statically maintained at Vcc. Transistors M6 and M7 hold nodes A and B to ground. So long as the clocks CLK and /CLK do not oscillate, the high voltage switches 200 and 300 and the clock circuit 500 consume no static power. The fact that the disabled high voltage switches 200 and 300 and their corresponding clock circuits 500 consume no static power is very important because a large number of these non-enabled circuits are likely to exist during any given programming cycle.

Figure 6:
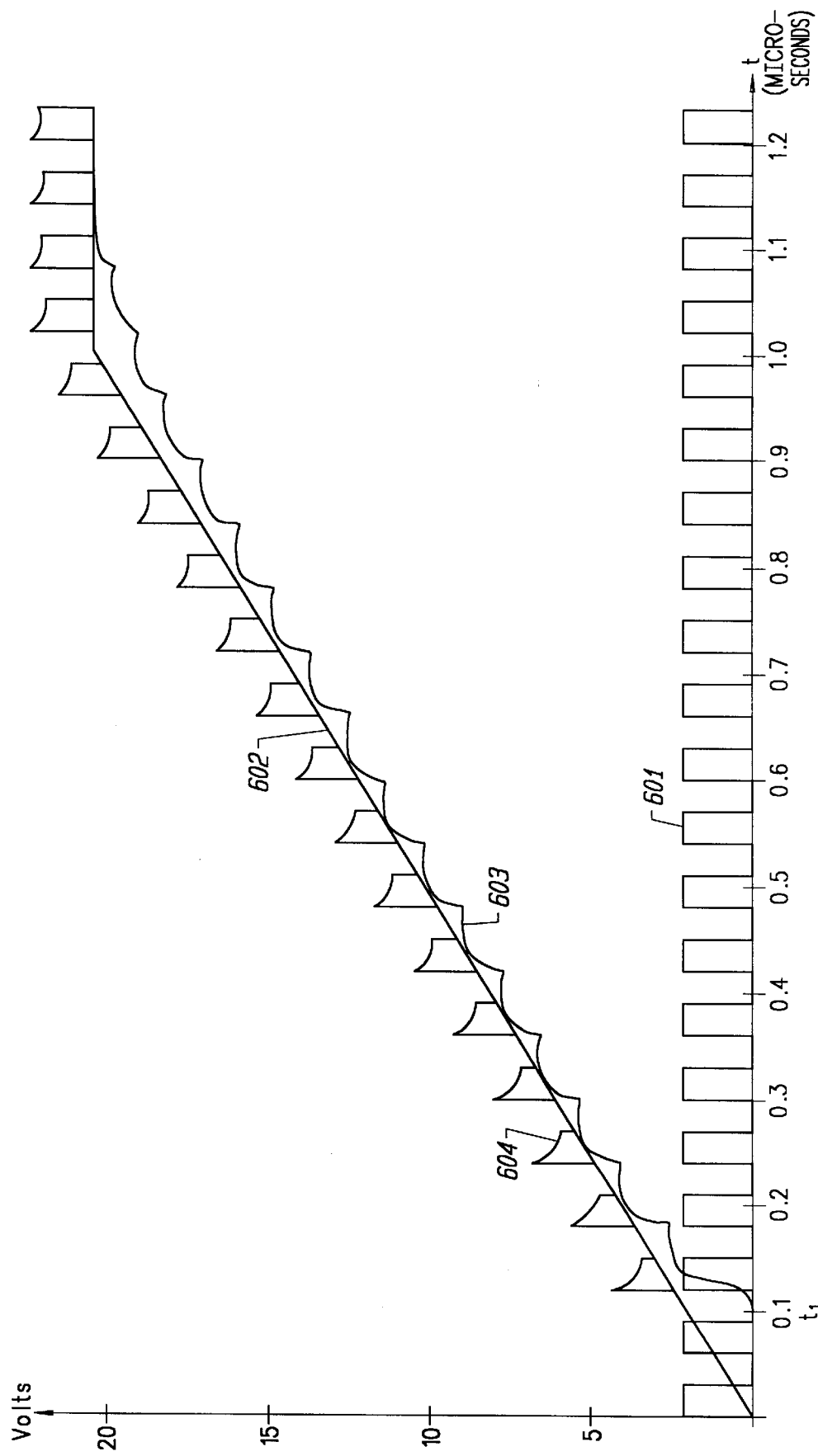
FIG. 6 illustrates a simulation result for a charging operation of a word line having a 2.0 volt supply voltage Vcc, a 20 Volt programming voltage Vpp, and a 16.7 MHZ oscillator frequency in which Vpp is charged from zero to 20 Volts over a 1 microsecond time period.

FIG. 6 illustrates the operation of the preferred embodiment 300 of the present invention during a charging operation. In the illustration of FIG. 6, Vcc is 2 volts, and the high programming voltage is 20 Volts. The oscillator signal OSC oscillates between 0 volts (ground) and 2 Volts (Vcc) with a 60 nanosecond period (16.67 MHZ) and is shown as trace 601. The high voltage generator (not shown) requires 1 microsecond (1000 nanoseconds) to increase Vpp from ground to 20 Volts. Vpp is illustrated as trace 602. The word line output OUT 603 is illustrated as trace 603. The trace 604 in FIG. 6 illustrates the voltage at node B during a programming operation. At time t1, the DECODE signal goes high, thus enabling nodes A and B and the output OUT to rise. During low phases of the clock CLK, transistor M2 ties node B to Vpp. At the rising edge of CLK, capacitive coupling initially charges node B to Vpp+Vcc*C1/(C1+CB), but regulation transistor M4 then discharges node B to Vpp+VtM4. The body effect increases the threshold voltage VtM4 of transistor M4 as the charge pump increases the voltages of Vpp and node B. Therefore, the difference between node B's voltage Vpp+Vcc*C1/(C1+CB) immediately after the rising edge of CLK and its voltage Vpp+VtM4 just before the falling edge end of CLK decreases as Vpp increases.

FIG. 6 illustrates a simulation result for the embodiment illustrated in FIG. 3. The transistor sizes and the clock frequency must be chosen such that the output OUT and node A can track Vpp during the high phases of CLK while node B can track Vpp during the low phases of CLK. For example, transistor M2 must be large enough that node B can be charged to Vpp during the high phase of CLK. In the embodiment of the circuit according to the present invention simulated in FIG. 6, the word line 603 attached to the output OUT has a 2 picofarad capacitance to ground. The capacitance C1 is 0.2 picofarad while the capacitance C2 is only 0.1 picofarad. The pass transistor MS has a 10 micron channel width and a 1.2 micron channel length. The boost transistor M1 has a 4 micron channel width and a 1.2 micron channel length. The boost transistor M2 has a 3 micron channel width and a 1.2 micron channel length. The regulation transistors M3 and M4 as well as the decode transistors M6 and M7 each have channel widths of 3 microns and long channel lengths of 4 microns.

Figure 7:
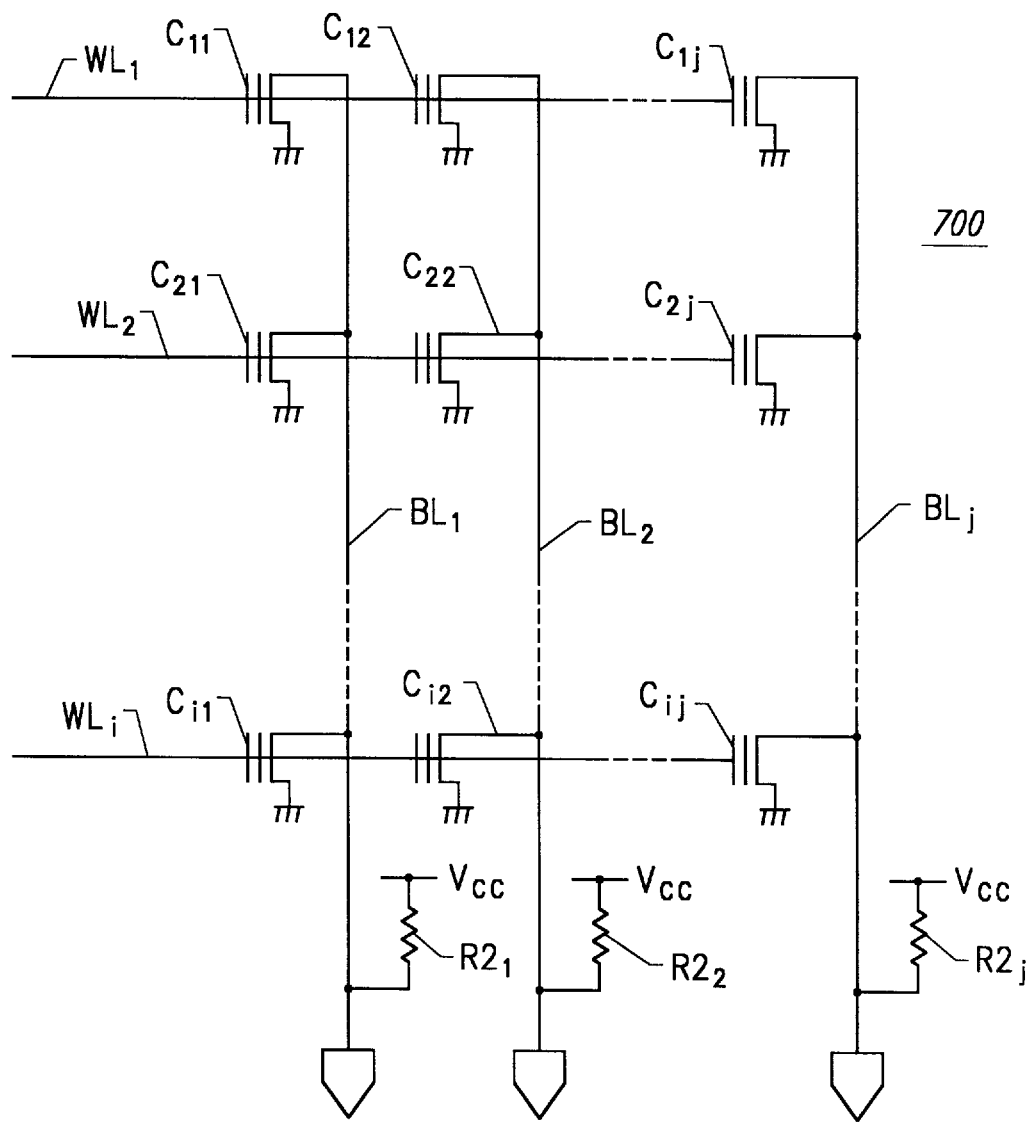
FIG. 7 is a circuit diagram illustrating a non-volatile memory cell array in accordance with an embodiment of the present invention.
Figure 8:
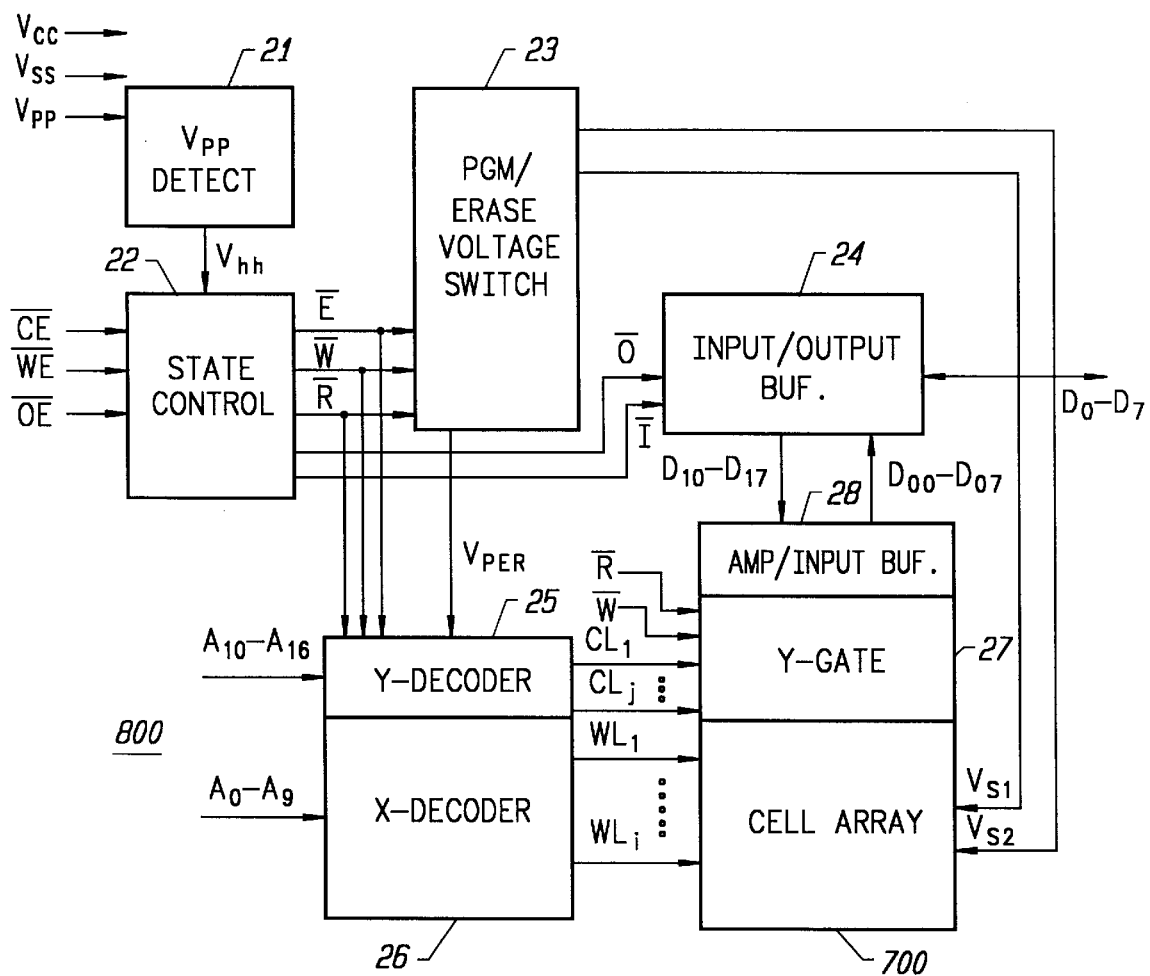
FIG. 8 is a block diagram illustrating a non-volatile memory integrated circuit architecture suitable for using the high voltage pass gate according to the present invention.

An example of a flash memory circuit cell array relating to the present invention is described below with reference to FIGS. 7 and 8. FIG. 7 is a circuit diagram illustrating a cell array 700 suitable for use using the high voltage pass gate according to the present invention. FIG. 8 is a block diagram illustrating a non-volatile memory integrated circuit architecture 800 including the memory control modules for a non-volatile memory cell array 700 in accordance with an embodiment of the present invention.

As shown in FIG. 8, a semiconductor memory device 800, such as a flash memory device, according to an embodiment of the present invention schematically comprises a cell array 700 having a plurality of memory cells, an X-decoder 26, and a Y-decoder 25 for arbitrarily selecting a memory cell of said cell array 700, an amplifier/input buffer unit 28 having sense amplifiers for memory cell reading, a program/erase voltage switch 23 for programming or erasing the information into/from selected memory cells, and a state control circuit 22 for selecting one of the enable signals in accordance with the memory state. Further, the cell array 700 in FIG. 8 is also embodied in FIG. 7 as having a plurality memory cells on each of the word lines and bit lines.

In FIG. 7, each word line of cell transistors C have their control gates commonly connected to the control gates of cell transistors $C_{11}$ to $C_{1j}$. Each column of multiple cell transistors C have their drains commonly connected to a bit line $BL_n$. Every cell transistor C has its source connected to ground GND. A voltage Vcc is applied to the bit lines $BL_1$ to $BL_n$ through load resistors $R_{21}$ to $R_{2j}$ for example, in order to steadily set the potentials of the cell transistors depending on whether data is written in the cell transistors. When one word line and one bit line are selected from among the lines $WL_1$ to $WL_i$ and $BL_1$ to $BL_j$, respectively, a single cell transistor is selected. Specifically, the selected cell is the cell $C_{mn}$ where the selected word line $WL_m$ and selected bit line $BL_n$ cross each other. If a data value "0" is stored in the cell transistor $C_{mn}$, the cell transistor $C_{mn}$ is turned "off" and the selected bit line $BL_n$ remains at Vcc as it is pulled up by resistor $R^2n$. On the other hand, if a data value "1" is stored in the cell transistor $C_{mn}$, the cell transistor $C_{mn}$ is turned on, and the selected bit line $BL_n$ is pulled down to a lower voltage by cell transistor $C_{mn}$. The potential of the bit line $BL_n$ is then read out as cell information by a sense amplifier in the amplifier/input buffer block 28.

A semiconductor memory device 800 having the cell array 700 is shown in FIG. 8. The device has a high voltage ($V_{pp}$) detector 21, a state control circuit 22, a program/erase voltage switch 23, an input/output buffer 24, an X-decoder 26, a Y-decoder 25, a Y-gate 27 and an amplifier/input buffer 28, which includes sense amplifiers for reading out the data value stored in a cell transistor. The high voltage ($V_{pp}$) detector 21 judges whether a high voltage $V_{pp}$ is available. If the high voltage $V_{pp}$ is available, the voltage detector outputs a "high" signal $V_{hh}$ to the state control circuit 22. If not, a "low" Vhh signal is output. The state control circuit 22 receives a chip enable signal CE/, a write enable signal WE/, and an output enable signal OE/ from external to the device 800 in addition to the signal $V_{hh}$ from the high voltage detector 21. From these signals, the state control circuit 22 determines the proper mode of operation; for example, the read, write, and erase modes are all determined.

In response to these signals, the state control circuit 22 outputs an output control signal O/, an input control signal I/, an erase signal E/, a write control signal W/ and a read signal R/. For example, when the read mode is selected, the state control circuit 22 receives a "low" chip enable signal CE/, a "low" output enable signal OE/, and a "high" write enable signal WE/. At the same time, the voltage signal $V_{hh}$ is "low", indicating that the high voltage $V_{pp}$ is not turned on. In turn, the state control circuit 22 provides "low" output control O/ and read R/ signals. The low R/ signal enables reading from the contents of the cell array 700; the low O/ signal allows the input output buffer 24 to drive the output pins (not shown) of the device 800. When the write mode is selected, the state control circuit 22 receives a "high" voltage signal Vhh and a "high" output enable signal OE/. The "high" voltage signal $V_{hh}$ indicates that the high voltage Vpp is present; the high output enable signal OE/ disables the input/output block 24 from driving the pins (not shown) of the device 800. At the same time, the chip enable signal CE/ and the write enable signal WE/ are "low". In turn, the state control circuit outputs a "low" input control signal I/, and a "low" write signal W/.

To select the erase mode, external circuitry (not shown) deasserts the chip enable signal CE/ to "high", deasserts the output enable signal OE/ to "high", and asserts the write enable signal WE/ to "low". In response, $V_{hh}$ goes high, indicating that the high voltage $V_{pp}$ is present, and then the state control circuit 22 asserts a "low" erase signal E/. When the program/erase voltage switch 23 receives a "low" erase signal E/, it switches the voltage of the cell array 700 power supply to the high voltage $V_{pp}$. When a "low" erase signal E/ or a "low" write signal W/ is input to the program/erase voltage switch 23, the switch 23 switches an output voltage VPER to the high voltage $V_{pp}$. $V_{PER}$ is supplied to the Y-decoder 25. When the input/output buffer 24 detects the falling edge that occurs at the high to low transition of the control signal I/, the input/output buffer 24 latches the input data D0–D7 that is received from an external device (not shown). The input data D0–D7 is then routed to the cell array 700 through lines $D_{I0}$–$D_{I7}$.

In contrast, when a falling edge of output control signal O/ is received, the buffer 24 latches output data $D_{O0}$-$D_{O7}$ from the cell array, and then outputs the data to the external device through the bidirectional lines D0-D7. The X-decoder is arranged to receive the address signals $A_m$ (m=0 to 9), the write signal W/, the read signal R/, and the erase signal E/. In response to these inputs, the X-decoder 25 outputs a select signal to the cell array in order to select the desired word line $WL_m$ by sending a "high" level signal to the word line $WL_m$. The Y-decoder 25 is arranged to receive the address signals $A_n$ (n=10 to 16), the write signal W/, and the read signal R/. In response to these inputs, the Y-decoder 25 outputs a bit line control signal $CL_n$ to a Y-gate 27. The Y-gate 27 selects the bit line $BL_n$ in order to read and write data corresponding to the bit line control signal $CL_n$. More specifically, in the write mode (i.e., when the write signal W/ is "low"), a high voltage $V_{pp}$ is supplied to the selected bit line $BL_n$. Then, the input data DI is input into the bit lines from the buffer 24. In the read mode, (i.e., when a "low" read signal R/ is input into the Y-gate 27) the selected bit line BLn is connected to a sense amplifier within the buffer 28. The cell information is then output from the sense amplifier within the buffer 28 as the output data $D_O$.

Figure 9:
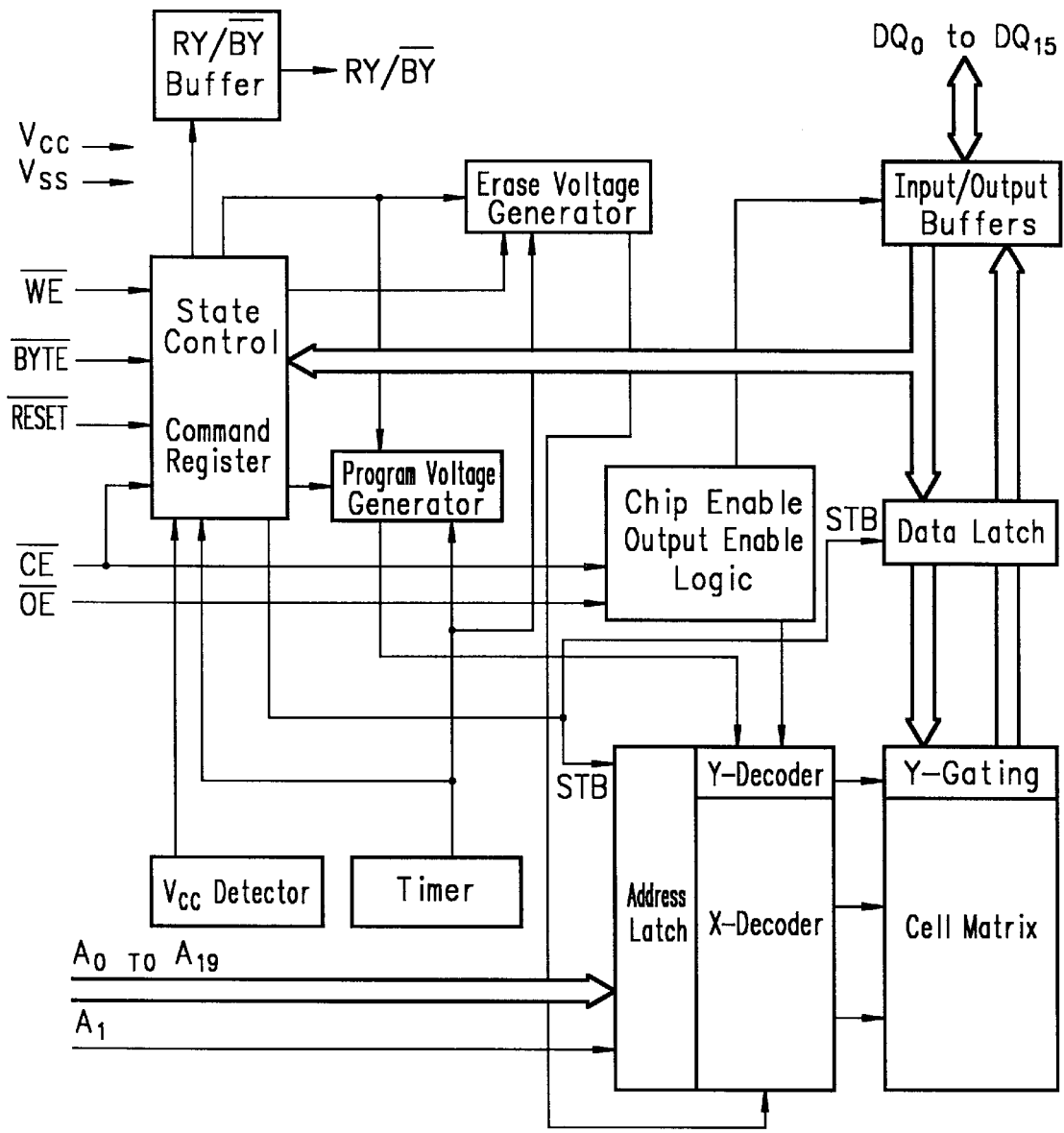
FIG. 9 is a block diagram illustrating another non-volatile memory integrated circuit architecture suitable for using the high voltage pass gate according to the present invention.

FIG. 9 illustrates another flash memory architecture suitable for use with the high voltage switch according to the present invention.

Although only a few embodiments of the present invention have been described herein, it should be apparent to those skilled in the art that the present invention may be embodied in many other specific forms without departing from the spirit or scope of the invention. Therefore, the present examples and embodiments are to considered as illustrative and not restrictive and the invention is not to be limited to the details given herein, but may be modified within the scope of the appended claims. As described above, an electrically erasable and electrically programmable non-volatile semiconductor device according to the present invention has a cell array comprised of tunnel-erase cell transistors with a double-gate structure including a floating gate.

As is apparent from the above discussion of the flash memory device according to the present invention, to perform various memory operations, the high voltage Vpp must be switched at appropriate times onto several nodes. For example, each of the word lines WL and each of the bit lines BL must be driven by the high voltage Vpp at certain times. Therefore, in order to allow the transmission of the high voltage Vpp onto the word lines, high voltage switches 300 according to the present invention such as illustrated in FIG. 3 can be built into the X-decoder 26. Each word line WL includes a high-voltage switch 300 which selectively connects the word line WL to Vpp. Thus, the node labeled OUT in FIG. 3 can be attached to a word line WL. If the X-decoder 26 includes a high-voltage switch 300 for each word line WL, then a large number of high-voltage switches 300 according to the present invention are resident on a given flash memory device 800. The high-voltage switch 300 is able to boost the word line WL to a high voltage Vpp in a small amount of time and with almost no leakage current from the Vpp charge pump (not shown) for unselected words, even when operating with low supply voltages Vcc.

While the present invention has been described in conjunction with its preferred and alternative embodiments, these embodiments are offered by way of illustration rather than by way of limitation. Those skilled in the art will be enabled by this disclosure to make various modifications and alterations to the embodiments described without departing from the spirit and scope of the present invention. Accordingly, these modifications and alterations are deemed to lie within the spirit and scope of the present invention as specified by the appended claims.

What is claimed is:

1. A flash erasable non-volatile memory having a high voltage switch, comprising:
    a plurality of floating gate memory cells each having a control gate;
    a word line coupled to the control gates of the plurality of floating gate memory cells;
    a first NMOS boost transistor having a source, a drain, and a gate;
    a second NMOS boost transistor having a source, a drain, and a gate;
    a first NMOS coupling capacitor having first and second terminals;
    a second NMOS coupling capacitor having first and second terminals;
    an NMOS pass transistor having a source, a drain, and a gate;
    a first NMOS discharge transistor having a source, a drain, and a gate; and
    a second NMOS discharge transistor having a source, a drain, and a gate;
    wherein the first NMOS boost transistor drain is connected to the second NMOS boost transistor gate and the second coupling capacitor second terminal;
    wherein the second NMOS boost transistor drain is connected to the first NMOS boost transistor gate, the first coupling capacitor second terminal, and the pass transistor gate;
    wherein the high voltage switch input is coupled to the NMOS pass transistor source, the first NMOS boost transistor source, and the second NMOS boost transistor source;
    wherein the first NMOS coupling capacitor first terminal is connected to a first clock input, and the second NMOS coupling capacitor first terminal is connected to a second clock input;
    wherein the NMOS pass transistor drain is connected to the word line;
    wherein the first NMOS discharge transistor source is connected to the first NMOS boost transistor drain;
    wherein the second NMOS discharge transistor source is connected to the second NMOS boost transistor drain.

2. A flash erasable non-volatile memory having a high voltage switch as in claim 1,
    wherein the first NMOS discharge transistor drain and the second NMOS discharge transistor drain are connected to a decode input.

3. A flash erasable non-volatile memory having a high voltage switch as in claim 2,
    wherein the first NMOS discharge transistor gate and the second NMOS discharge transistor gate are connected to a positive power supply.

4. A flash erasable non-volatile memory having a high voltage switch as in claim 3,
    wherein the first clock input and the second clock input are never simultaneously asserted.

5. A flash erasable non-volatile memory having a high voltage switch as in claim 4,
    wherein the second clock input is a logical inverse of the first clock input.

6. A flash erasable non-volatile memory having a high voltage switch as in claim 5, further comprising:
    a two-input NAND gate having the decode input and an oscillator signal as inputs.

7. A flash erasable non-volatile memory having a high voltage switch as in claim 6,
    wherein the two-input NAND gate produces the second clock as output.

8. A flash erasable non-volatile memory having a high voltage switch as in claim 7 further comprising:
    an inverter having the second clock as input and producing the first clock as output.

9. A flash erasable non-volatile memory having a high voltage switch as in claim 8, further comprising:
    one or more parallel NMOS pass transistors having their sources connected to the high voltage supply, having their gates connected to the second NMOS boost transistor drain, and having their drains connected to one or more parallel high voltage switch outputs.

10. A flash erasable non-volatile memory having a high voltage switch, comprising:
    a plurality of floating gate memory cells each having a control gate;
    a word line coupled to the control gates of the plurality of floating gate memory cells;
    a first NMOS boost transistor having a source, a drain, and a gate;
    a second NMOS boost transistor having a source, a drain, and a gate;
    a first NMOS coupling capacitor having first and second terminals;
    a second NMOS coupling capacitor having first and second terminals;
    an NMOS pass transistor having a source, a drain, and a gate;
    a first NMOS regulation transistor having a source, a drain, and a gate; and
    a second NMOS regulation transistor having a source, a drain, and a gate;
    wherein the first NMOS boost transistor drain is connected to the second NMOS boost transistor gate and the second coupling capacitor second terminal;
    wherein the second NMOS boost transistor drain is connected to the first NMOS boost transistor gate, the first coupling capacitor second terminal, and the pass transistor gate;
    wherein the high voltage switch input is coupled to the NMOS pass transistor source, the first NMOS boost transistor source, and the second NMOS boost transistor source;
    wherein the first NMOS coupling capacitor first terminal is connected to a first clock input, and the second NMOS coupling capacitor first terminal is connected to a second clock input;

wherein the NMOS pass transistor drain is connected to the word line;

wherein the first NMOS regulation transistor source and gate are connected to the first NMOS boost transistor drain;

wherein the second NMOS regulation transistor source and gate are connected to the second NMOS boost transistor drain; and wherein the high voltage switch input is connected to the first NMOS regulation transistor drain and the second NMOS regulation transistor drain.

11. A flash erasable non-volatile memory having a high voltage switch as in claim 10, wherein the first clock input and the second clock input are never simultaneously asserted.

12. A flash erasable non-volatile memory having a high voltage switch as in claim 11, wherein the second clock input is a logical inverse of the first clock input.

13. A flash erasable non-volatile memory having a high voltage switch as in claim 12, further comprising:

a two-input NAND gate having the decode input and an oscillator signal as inputs.

14. A flash erasable non-volatile memory having a high voltage switch as in claim 13, wherein the two-input NAND gate produces the second clock as output.

15. A flash erasable non-volatile memory having a high voltage switch as in claim 14, further comprising:

an inverter having the second clock as input and producing the first clock as output.

16. A flash erasable non-volatile memory having a high voltage switch as in claim 10, further comprising:

one or more parallel NMOS pass transistors having their sources connected to the high voltage supply, having their gates connected to the second NMOS boost transistor drain, and having their drains connected to one or more parallel high voltage switch outputs.

17. A flash erasable non-volatile memory having a high voltage switch, comprising:

a plurality of floating gate memory cells each having a control gate;

a word line coupled to the control gates of the plurality of floating gate memory cells;

a first NMOS boost transistor having a source, a drain, and a gate;

a second NMOS boost transistor having a source, a drain, and a gate;

a first NMOS coupling capacitor having first and second terminals;

a second NMOS coupling capacitor having first and second terminals;

an NMOS pass transistor having a source, a drain, and a gate;

a first NMOS regulation transistor having a source, a drain, and a gate;

a second NMOS regulation transistor having a source, a drain, and a gate;

a first NMOS discharge transistor having a source, a drain, and a gate; and a second NMOS discharge transistor having a source, a drain, and a gate;

wherein the first NMOS boost transistor drain is connected to the second NMOS boost transistor gate and the second coupling capacitor second terminal;

wherein the second NMOS boost transistor drain is connected to the first NMOS boost transistor gate, the first coupling capacitor second terminal, and the pass transistor gate;

wherein the high voltage switch input is coupled to the NMOS pass transistor source, the first NMOS boost transistor source, and the second NMOS boost transistor source;

wherein the first NMOS coupling capacitor first terminal is connected to a first clock input, and the second NMOS coupling capacitor first terminal is connected to a second clock input;

wherein the NMOS pass transistor drain is connected to the word line;

wherein the first NMOS regulation transistor source and gate are connected to the first NMOS boost transistor drain;

wherein the second NMOS regulation transistor source and gate are connected to the second NMOS boost transistor drain;

wherein the high voltage switch input is connected to the first NMOS regulation transistor drain and the second NMOS regulation transistor drain;

wherein the first NMOS discharge transistor source is connected to the first NMOS boost transistor drain; and wherein the second NMOS discharge transistor source is connected to the second NMOS boost transistor drain.

18. A flash erasable non-volatile memory having a high voltage switch as in claim 17, wherein the first NMOS discharge transistor drain and the second NMOS discharge transistor drain are connected to a decode input.

19. A flash erasable non-volatile memory having a high voltage switch as in claim 18, wherein the first NMOS discharge transistor gate and the second NMOS discharge transistor gate are connected to a positive power supply.

20. A flash erasable non-volatile memory having a high voltage switch as in claim 19, wherein the first clock input and the second clock input are never simultaneously asserted.

21. A flash erasable non-volatile memory having a high voltage switch as in claim 20, wherein the second clock input is a logical inverse of the first clock input.

22. A flash erasable non-volatile memory having a high voltage switch as in claim 21, further comprising:

a two-input NAND gate having the decode input and an oscillator signal as inputs.

23. A flash erasable non-volatile memory having a high voltage switch as in claim 22, wherein the two-input NAND gate produces the second clock as output.

24. A flash erasable non-volatile memory having a high voltage switch as in claim 23, further comprising:

an inverter having the second clock as input and producing the first clock as output.

25. A flash erasable non-volatile memory having a high voltage switch as in claim 17, further comprising:

one or more parallel NMOS pass transistors having their sources connected to the high voltage supply, having their gates connected to the second NMOS boost transistor drain, and having their drains connected to one or more parallel high voltage switch outputs.

* * * * *